United States Patent [19]
Nishide et al.

[11] Patent Number: 6,036,798
[45] Date of Patent: Mar. 14, 2000

[54] PROCESS FOR PRODUCING ELECTRONIC PART WITH LAMINATED SUBSTRATES

[75] Inventors: Mitsuyoshi Nishide; Hiroji Tani, both of Kyoto, Japan

[73] Assignee: Murata Manufacturing Co., Ltd., Japan

[21] Appl. No.: 09/134,569

[22] Filed: Aug. 14, 1998

Related U.S. Application Data

[62] Division of application No. 08/895,519, Jul. 17, 1997, Pat. No. 5,840,382, which is a continuation of application No. 08/068,123, May 27, 1993, abandoned.

[30]     Foreign Application Priority Data

May 28, 1992  [JP]  Japan ..................................... 4-135475

[51] Int. Cl.⁷ ........................... H03H 03/00; H05K 03/46
[52] U.S. Cl. ........................ 156/89.12; 156/150; 264/666
[58] Field of Search .................... 156/150, 151, 156/89.12; 264/666, 672; 428/209, 210, 901

[56]     References Cited

U.S. PATENT DOCUMENTS

| | | | |
|---|---|---|---|
| 3,634,785 | 1/1972 | Kameya | 333/140 |
| 4,322,698 | 3/1982 | Takahashi et al. | 333/184 |
| 4,342,143 | 8/1982 | Jennings | 29/25.42 |
| 4,437,140 | 3/1984 | Ohyama et al. | 361/765 |
| 4,555,291 | 11/1985 | Tait et al. | 156/250 |
| 4,714,905 | 12/1987 | Bernstein et al. | 333/167 |
| 5,834,835 | 11/1998 | Maekawa | 257/680 |

*Primary Examiner*—Francis J. Lorin
*Attorney, Agent, or Firm*—Ostrolenk, Faber, Gerb & Soffen, LLP

[57]     ABSTRACT

An electronic part having a plurality of substrates and a process for producing the same are disclosed, the electronic part comprising (1) a laminate comprising at least two previously fired substrates different in electrical characteristics each containing in the inside thereof a passive element, and an adhesive layer comprising glass which is interposed between said substrates, and (2) an outer electrode which is formed on the surface of the laminate of the substrates and is electrically connected to the passive elements, and the process comprising the steps of: separately firing at least two substrates different in electrical characteristics each containing in the inside thereof a passive element; adhering the substrates with an adhesive comprising glass; and forming an outer electrode on the surface of the laminate of the substrates in electrical connection to each passive element. Each substrate is free from warpage or cracking and containing no part remaining non-sintered.

3 Claims, 4 Drawing Sheets

PROCESS FOR PRODUCING ELECTRONIC PART WITH LAMINATED SUBSTRATES

RELATED APPLICATIONS

This is a divisional of application Ser. No. 08/895,519, filed Jul. 17, 1997, now U.S. Pat. No. 5,840,382, which is a continuation of Ser. No. 08/068,123, filed May 27, 1993, now abandoned.

FIELD OF THE INVENTION

The present invention relates to an electronic part and a process for producing the same. More particularly, it relates to an electronic part comprising at least two laminated substrates different in electrical characteristics and each having in the inside thereof a passive element, such as a coil, a capacitor, and a resistor, and a process for producing such an electronic part.

BACKGROUND OF THE INVENTION

Chip electronic parts of surface mounting type, which comprise a laminate of, for example, a high-dielectric substrate containing in the inside thereof a capacitor and a low-dielectric (insulating) substrate containing in the inside thereof a coil, have been proposed. Laminating of such a plurality of substrates different in electrical characteristics into a single chip has conventionally been carried out by (1) a process comprising providing passive elements on each of ceramic green sheets having different electrical characteristics by printing or the like technique, laminating these green sheets, and press bonding into one body or (2) a process comprising alternately printing an insulating layer and a conductive layer (e.g., a coil pattern) on previously laminated ceramic green sheets (containing in the inside thereof a capacitor) to form multiple layers and co-firing the layers.

Co-firing of a plurality of ceramic green sheets different in electrical characteristics has been accompanied with problems, such as warping or cracking of the substrate and remaining of non-sintered parts. This is because each material has its own firing temperature characteristics or shrinkage characteristics and therefore requires the respective firing atmosphere. Unless these conditions be met, the above-mentioned problems occur in co-firing.

It has been proposed to incorporate appropriate additives to the ceramic green sheet or to provide an intermediate layer comprising both the materials constituting each of the different green sheets so as to change the firing characteristics by gradations. However, such a manipulation causes deterioration of characteristics of each substrate.

SUMMARY OF THE INVENTION

An object of the present invention is to provide an electronic part comprising at least two substrates different in electrical characteristics laminated with each other without causing defects, such as warpage or cracks of the substrates.

Another object of the present invention is to provide a process for producing an electronic part comprising at least two substrates different in electrical characteristics laminated with each other without causing defects, such as warpage or cracks of the substrates.

Other objects and effects of the present invention will be apparent from the following description.

The present invention provides an electronic part comprising (1) a laminate comprising at least two previously fired substrates different in electrical characteristics each containing in the inside thereof a passive element, and an adhesive layer comprising glass which is interposed between the substrates, and (2) an outer electrode which is formed on the surface of the laminate of the substrates and is electrically connected to the passive elements.

The present invention also provides a process for producing an electronic part comprising the steps of:

separately firing at least two substrates different in electrical characteristics each containing in the inside thereof a passive element;

adhering the fired substrates with an adhesive comprising glass to form a laminate; and forming an outer electrode on the surface of the laminate of the substrates in electrical connection to each passive element.

According to the present invention, since each of substrates having different electrical characteristics is previously fired under conditions meeting the respective characteristics, problems arising from co-firing, i.e., warpage or cracks of the substrates or remaining of non-sintered parts, can be eliminated. Furthermore, each passive element block, such as a capacitor block, a coil block, and a resistor block, which is contained in the substrate, can be prepared in a stable manner; alteration of characteristics and screening of defectives for each block are easy; and relative freedoms are afforded in circuit designing and its alteration per one chip.

DESCRIPTION OF THE PREFERRED EMBODIMENTS

The present invention will be illustrated in detail by referring to the accompanying drawings but is not construed as being limited thereto.

Figure 1:
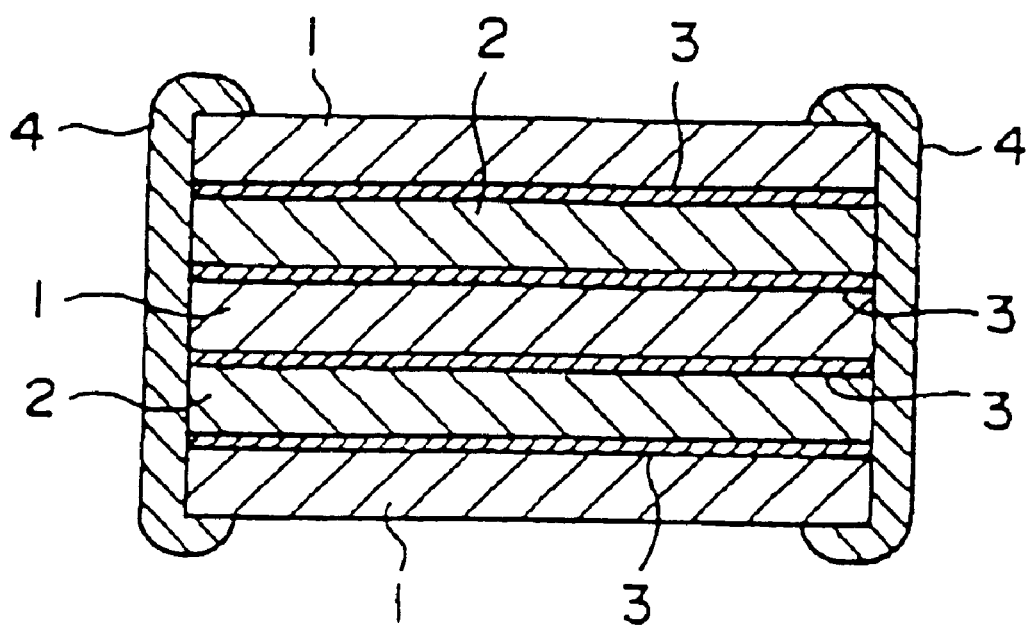
FIG. 1 shows a cross section of one embodiment of the electronic part according to the present invention.

One embodiment of the electronic part according to the present invention, a coil/capacitor composite part, is shown in FIG. 1, in which numeral 1 indicates a first substrate; 2 indicates a second substrate; 3 indicates an adhesive layer, and 4 indicates an outer electrode.

First substrate 1 comprises a low-temperature sintering $BaO-SiO_2-Al_2O_3$ ceramic material (specific dielectric constant $\in$=4 to 20), while second substrate 2 comprises a low-temperature sintering $BaO-TiO_2$ ceramic material ($\in$=1,000 to 2,000). A coil pattern is formed with a conductive paste on the surface of low-dielectric substrate 1 while green, another green sheet is laminated thereon, and the laminated green sheets are fired. A capacity electrode pattern is formed on the surface of high-dielectric substrate 2 while green, another green sheet is laminated thereon, and the laminated green sheets are fired. There are thus prepared substrate 1 functioning as a coil block and substrate 2 functioning as a capacitor block.

Examples of the ceramic material used as the low-dielectric first substrate include a $TiO_2-SrO$ ceramic material, an $Nd_2O_3-TiO_2-BaO$ ceramic material, and an $Al_2O_3$ ceramic material. These are in addition to the above-mentioned $BaO$—$SiO_2$—$Al_2O_3$ and $BaO$—$TiO_2$ ceramic materials which can be used in the first and second substrates, respectively.

The substrate containing in the inside thereof a passive element can be prepared by laminating green sheets provided with an appropriate conductor pattern followed by firing as described above, but is not limited to such a method.

The passive elements and materials of the substrates which can be used in the present invention are not particularly limited to the above-mentioned specific examples of substrates 1 and 2, and various other materials may be selected in connection with various passive elements to be integrated therein.

Adhesive layer 3 comprising glass is provided between each facing pair of substrates 1 and 2. The glass, as a main component of the adhesive layer which can be used in the present invention, is preferably selected from those which undergo a moderate diffusion reaction with the surface of each substrate to adhere two substrates and can be fired (hardened) at a low temperature of from 400 to 1,000° C. so as not to adversely affect the substrates. It is preferred to use $PbO$—$ZnO$—$B_2O_3$ amorphous glass or $ZnO$—$SiO_2$—$B_2O_3$ amorphous glass from the standpoint of diffusion and bonding properties and low-temperature (400 to 1,000° C.) setting properties for causing no adverse influence on substrates.

In adhesion of $BaO$—$SiO_2$—$Al_2O_3$ ceramic substrate 1 and $BaO$—$TiO_2$ ceramic substrate 2, it is particularly preferred to use $ZnO$—$SiO_2$—$B_2O_3$ amorphous glass. The glass material thus supplied between the two substrates diffuses to a depth of about 10 $\mu$m from the surface of each substrate to thereby adhere them. Each green sheet constituting substrate 1 or 2 preferably has a thickness of at least 40 $\mu$m so as to protect the inside passive element from the influence of glass diffusion.

Examples of the glass used in adhesive layer 3 include $SiO_2$—$Al_2O_3$—$PbO$ crystalline glass, $SiO_2$—$B_2O_3$—$CaO$ crystalline glass, $SiO_2$—$Al_2O_3$—$B_2O_3$ crystalline glass, and their amorphous glass, in addition to the above-mentioned $PbO$—$ZnO$—$B_2O_3$ amorphous glass and $ZnO$—$SiO_2$—$B_2O_3$ amorphous glass. The glass may contain a filler.

Adhesive layer 3 may have in the inside thereof a via hole and a conductor pattern forming a wiring circuit.

The dielectric constant of adhesive layer 3 is preferably 10 or less, and more preferably from 3.5 to 10. The delay of electric signals passing through a conductor in a dielectric material is proportional to the square root of the dielectric constant of the dielectric material. A material having a high dielectric constant is therefore disadvantageous for high-speed signal transfer. If a low-dielectric substrate and a high-dielectric substrate are used in combination as described above, the delay of signals may occur in a conductor which is positioned in the low-dielectric substrate but near the high-dielectric substrate because of the floating capacitance occurred in the lowdielectric substrate by the high-dielectric substrate. The adhesive layer having a low dielectric constant of 10 or less functions as a buffer layer between the low-dielectric substrate and the high-dielectric substrate and suppresses the floating capacitance. The effect of suppressing the floating capacitance can be increased by reducing the dielectric constant of the adhesive layer and/or increasing the thickness of the adhesive layer.

When adhesive layer 3 contains a via hole or a conductor circuit therein, it is preferred that the dielectric constant of adhesive layer 3 is as low as possible from the standpoint of the signal transfer speed.

The thickness of the adhesive layer is generally from 20 to 350 $\mu$m. Where adhesive layer 3 contains conductor circuits therein and high insulation reliability (e.g., breakdown voltage of 300 V/mil or more) is required, the thickness of adhesive layer 3 is preferably 40 $\mu$m or more.

The substrates are laminated with each other through the adhesive layer to form a laminate of the substrates.

Outer electrode 4 is provided on the surface of the laminate of the substrate in such a manner that outer electrode 4 is electrically connected to the passive elements contained in the substrates.

Examples of materials which can be used for formation of outer electrodes 4 include Au, Ag, Cu, Ag—Pd, Ag—Pt, and the like. The electrode material is preferably selected in such a manner that it can be fired simultaneously with adhesive 3 and can be electrically connected to the inside passive element without penetrating into substrates 1 and 2 and without forming an alloy with the inside passive element. In this particular embodiment of using $BaO$—$SiO_2$—$Al_2O_3$ substrate 1 and $BaO$—$TiO_2$ substrate 2, outer electrodes 4 are formed by using Cu having satisfactory electrical characteristics, and the coated Cu paste and adhesive 3 are simultaneously fired in a reducing atmosphere at a temperature of from 700 to 900° C.

Figure 2:
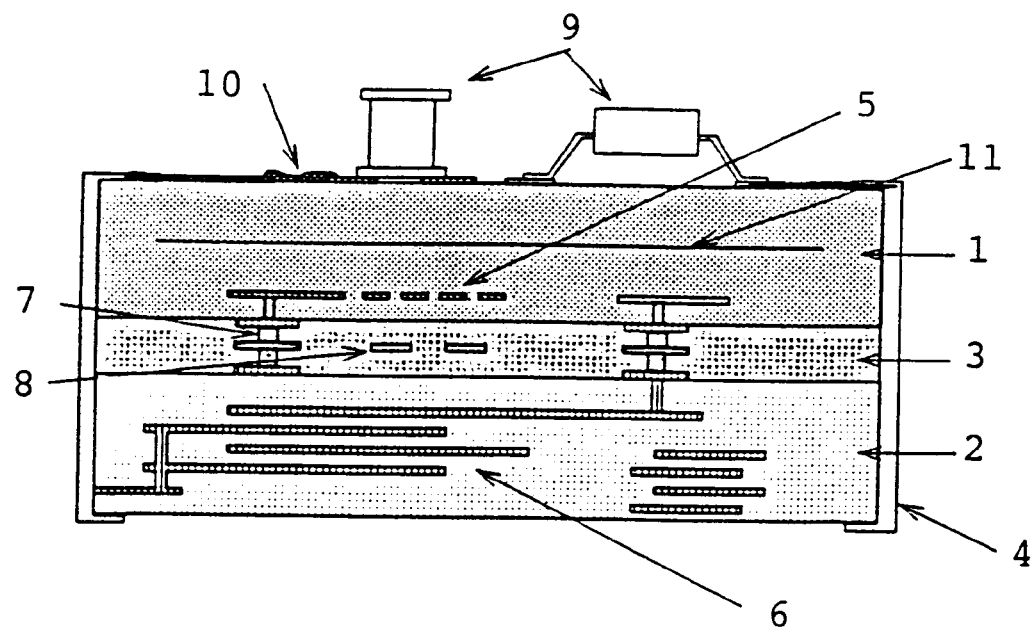
FIG. 2 is a cross section of another embodiment of the electronic part according to the present invention.

FIG. 2 shows a cross sectional view of a specific non-limiting example of a coil/capacitor composite part according to the present invention, in which numeral 1 indicates a low-dielectric substrate containing coil element 5 and ground earth layer 11; 2 indicates a high-dielectric substrate containing capacitor element 6; and 3 indicates an adhesive layer containing via hole 7 and conductor circuit 8. Numeral 9 indicates an electronic part surface-mounted on an electrode provided on the surface of the coil/capacitor composite part, and 10 indicates a film resistor provided on the surface of the composite part. Film resistor 10 and the electrode on which electronic part 9 is surface-mounted can be provided by any conventional manner. While film resistor 10 and the electrode on which electronic part 9 is surface-mounted are provided on low-dielectric substrate 1 in FIG. 2, they may also be provided on high-dielectric substrate 2.

Figure 3:
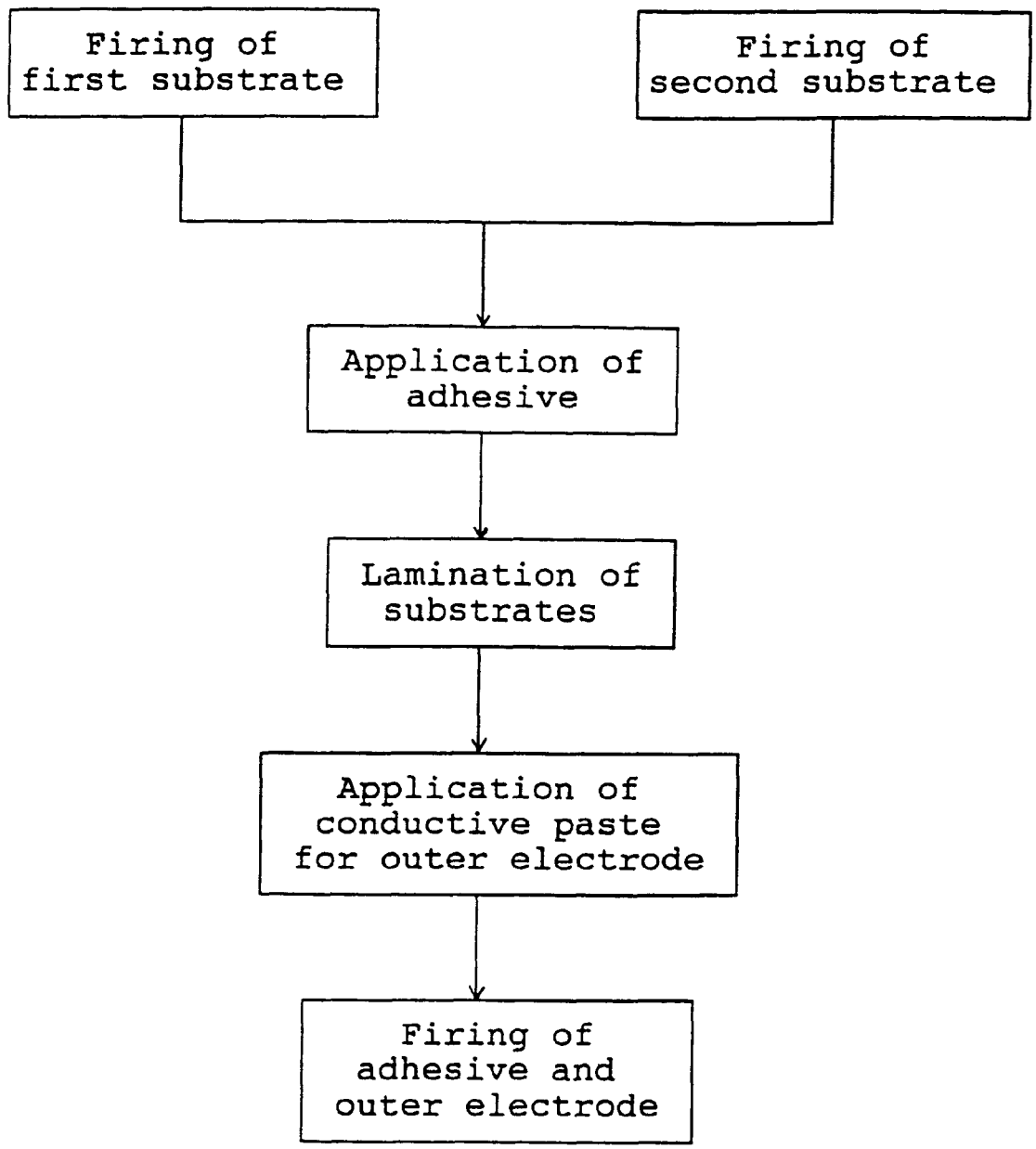
FIG. 3 is a flow chart illustrating one embodiment of the process according to the present invention.

One embodiment of the process for producing the electronic part according to the present invention, a coil/capacitor composite part, will be described in detail with reference to the flow chart shown in FIG. 3.

In the production of the electronic part of the present invention, each substrate is separately prepared by being fired. For example, as described foregoing, a first substrate composed of a laminate of ceramic green sheets having a low dielectric constant and a coil conducting layer and a second substrate composed of a laminate of ceramic green sheets having a high dielectric constant and a capacitance electrode are separately fired. Then, these substrates are bonded together via an adhesive comprising glass, and then dried.

Adhesive layer 3 comprising glass can be supplied between each facing pair of substrates 1 and 2 either by screen printing or in the form of a sheet. Where adhesive layer 3 is supplied by screen printing, a glass material is kneaded with 10 to 80% by weight of an organic vehicle, such as an acrylic varnish which is obtained by dissolving an acrylic resin in a solvent (e.g., terpineol) and is easy to degreased, and the resulting paste is printed on substrates 1 and 2, followed by lamination. Where adhesive layer 3 is supplied as a sheet, a glass material, a binder (e.g., an acrylic resin or a butyral resin), a dispersant (e.g., sorbitan fatty acid esters), a plasticizer (e.g., dioctylphthalate), etc. are slurried with a solvent, e.g., toluene, the slurry is sheeted by means of a doctor blade, and the sheet is cut to an appropriate size and temporarily bonded between substrates 1 and 2 with a solvent.

When adhesive layer 3 contains a via hole and/or a conductor circuit therein, it can be prepared by screen printing an appropriate adhesive pattern and conductor pattern, or making an appropriate hole in a sheet of adhesive layer and embedding a conductor in the hole. The via hole and/or conductor circuit can also be provided by screen printing adhesive and conductor patterns twice or more, or using two or more of sheets of adhesive layer each having or not having a conductor embedded therein, so as to form an adhesive layer having a multi-layer structure.

An outer electrode can be formed by coating a conductive paste on the surface of the thus bonded (laminated) substrates followed by firing; or by coating a conductive paste on the side surface of each substrate before being fired, firing both the conductive paste and the substrate simultaneously, adhering the two or more substrates having electrodes via the above-mentioned adhesive to form a laminate of the substrates, and electrically connecting the outer electrodes on each side of the bonded substrates with a conductive material.

In this particular embodiment, outer electrode 4 is formed by coating a conductive paste on each side surface of the laminate of substrates 1 and 2 followed by firing. The firing temperature generally ranges from 600 to 1,000° C., while varying depending on the components of the conductive paste. By this firing, both adhesive 3 and outer electrodes 4 are simultaneously fired.

Figure 4:
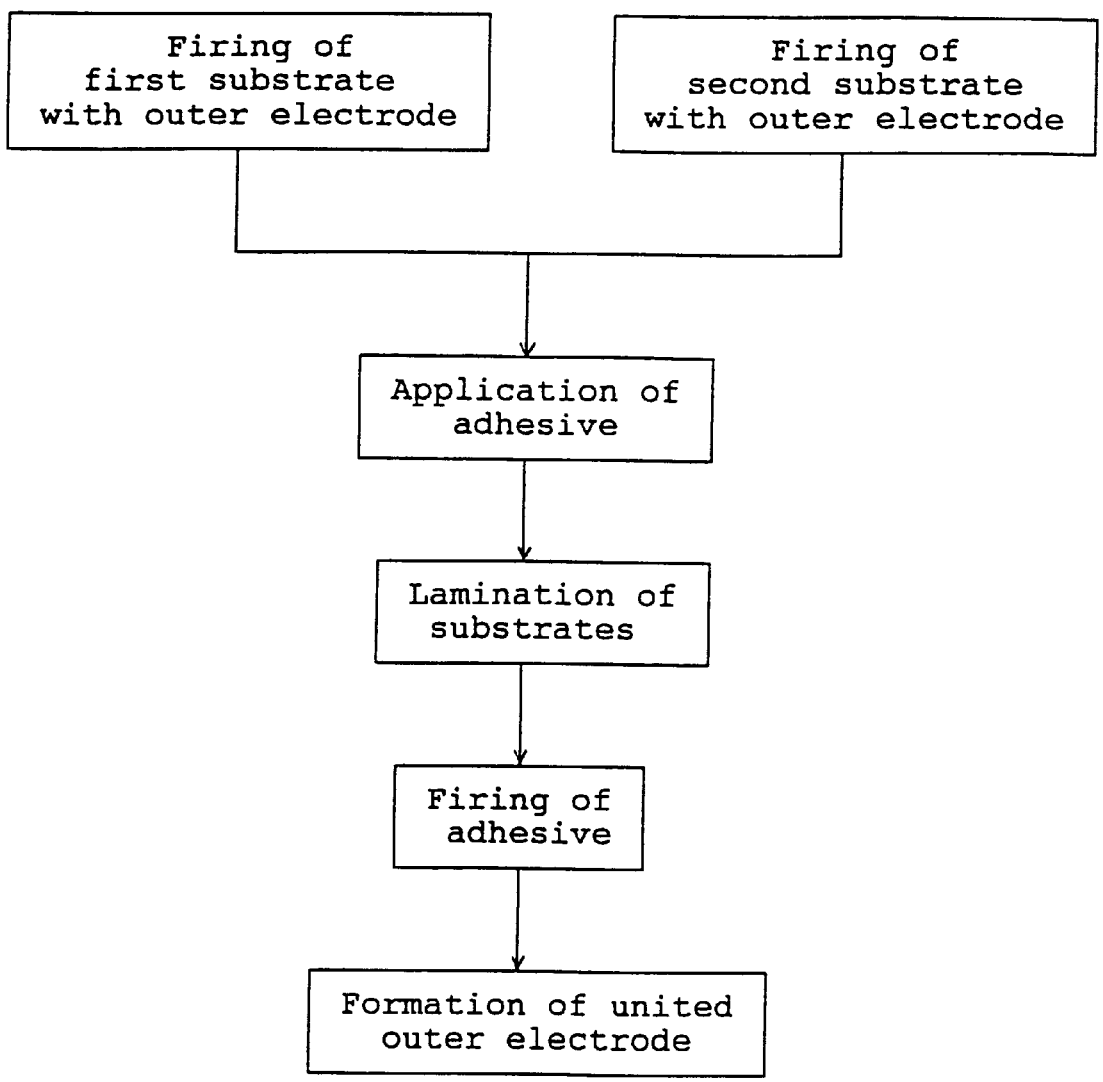
FIG. 4 is a flow chart illustrating another embodiment of the process according to the present invention.

FIG. 4 illustrates the flow chart of another embodiment of the process according to the present invention. In this embodiment, a conductive paste is coated on both side surfaces of each ceramic green sheet laminates containing therein a passive element, and the ceramic green sheet laminate and the conductive paste are simultaneously fired to form outer electrodes 4. Adhesive 3 is then supplied between substrates 1 and 2 each having outer electrode 4 in the same manner as described above, uniting the plurality of substrates, and, after drying, adhesive 3 is fired. Thereafter, the independent plural outer electrodes 4 formed on each side of the substrates are connected to each other by soldering or coating a conductive material, such as a conductive resin, so as to form united outer electrode 4.

In the present invention, since each of substrates different in electrical characteristics is separately fired under the respective optimum conditions, it is freed of drawbacks such as warpage, cracks, and occurrence of non-sintered parts, thus making a great contribution to improvement in product yield. Further, by previously preparing capacitor blocks, coil blocks or resistor blocks according to various specifications, any alterations in characteristics as an electronic part can rapidly be coped with. Screening of defectives can be conducted for each passive element block. various passive element blocks may be combined arbitrarily, making circuit designing and design alteration easy.

The present invention is widely applicable to electronic parts such as LC resonance circuits, radiofrequency filters, and DC convertors.

While the invention has been described in detail and with reference to specific examples thereof, it will be apparent to one skilled in the art that various changes and modifications can be made therein without departing from the spirit and scope thereof.

What is claimed is:

1. A process for producing an electronic part comprising the step of:

separately firing at least two substrates different in electrical characteristics each containing in the inside thereof a passive element;

adhering the substrates with an adhesive comprising glass to form a laminate; and forming an outer electrode on the surface of said laminate of the substrates in electrical connection to each passive element.

2. A process as claimed in claim 1, wherein the step of forming an outer electrode comprises the steps of: coating a conductive paste on the surface of said laminate of the substrates having been adhered via said adhesive layer; and fired said conduction paste.

3. A process as claimed in claim 1, wherein the step of forming an outer electrode comprises the steps of: coating a conductive paste on the side surface of each substrate before being fired; firing said coated paste simultaneously with said substrate; and electrically connecting said outer electrodes formed on each side of said each substrate after being adhered with said adhesive.

* * * * *